(12) United States Patent
Yu et al.

(10) Patent No.: US 10,079,574 B2
(45) Date of Patent: Sep. 18, 2018

(54) WIDEBAND ADAPTIVE BIAS CIRCUITS FOR POWER AMPLIFIERS

(71) Applicant: MediaTek Inc., Hsin-Chu (TW)

(72) Inventors: Hsing-ting Yu, San Jose, CA (US); Fei Song, San Jose, CA (US); I-Chang Wu, Fremont, CA (US); YuenHui Chee, Redwood City, CA (US); Chiyuan Lu, San Jose, CA (US); Keng Leong Fong, Sunnyvale, CA (US); Osama K. A. Shana'a, San Jose, CA (US)

(73) Assignee: MediaTek Inc., Hsin-Chu (TW)

( * ) Notice: Subject to any disclaimer, the term of this patent is extended or adjusted under 35 U.S.C. 154(b) by 36 days.

(21) Appl. No.: 15/019,409

(22) Filed: Feb. 9, 2016

(65) Prior Publication Data

US 2017/0230006 A1 Aug. 10, 2017

(51) Int. Cl.
*H03F 3/45* (2006.01)
*H03F 1/02* (2006.01)
*H03F 3/193* (2006.01)
*H03F 3/21* (2006.01)

(52) U.S. Cl.
CPC ............ *H03F 1/0222* (2013.01); *H03F 3/193* (2013.01); *H03F 3/211* (2013.01); *H03F 3/45* (2013.01); *H03F 3/45071* (2013.01); *H03F 3/45183* (2013.01); *H03F 2200/451* (2013.01); *H03F 2200/465* (2013.01); *H03F 2200/555* (2013.01); *H03F 2203/21106* (2013.01)

(58) Field of Classification Search
CPC ........ H03F 1/0222; H03F 3/193; H03F 3/211; H03F 1/0261; H03F 1/30; H03F 1/302; H03F 3/04; H03G 3/30; G05F 3/262; G05F 3/265; G05F 3/267
USPC ................... 330/117, 285, 288, 296, 301
See application file for complete search history.

(56) References Cited

U.S. PATENT DOCUMENTS

| | | | |
|---|---|---|---|
| 6,930,538 B2 * | 8/2005 | Chatal ................ | G05F 3/267 327/539 |
| 7,057,463 B2 * | 6/2006 | Wakii ................. | H03F 1/0205 330/257 |
| 7,183,852 B2 * | 2/2007 | Abe .................... | H03F 3/4521 330/257 |

(Continued)

OTHER PUBLICATIONS

Onizuka et al., "A 2.4 GHz CMOS Doherty Power Amplifier with Dynamic Biasing Scheme," IEEE Asian Solid-State Circuits Conference, Nov. 12-14, 2012, 93-96, Kobe, Japan.

(Continued)

*Primary Examiner* — Khanh V Nguyen
(74) *Attorney, Agent, or Firm* — Wolf, Greenfield & Sacks, P.C.

(57) ABSTRACT

Methods and apparatus for providing adaptive biasing to power amplifiers. Adaptive bias circuits are configured to provide sharp turn on and/or current clamping to improve the efficiency of a power amplifier over a wide input signal bandwidth. Sharp turn on may be achieved using a subtraction technique to subtract outputs from multiple detectors. Clamping may be achieved using MOSFET device characteristics to pull the device from the triode region into the saturation, subtraction techniques to subtract the outputs from multiple detectors, and/or by using circuit devices, such as diodes.

12 Claims, 15 Drawing Sheets

(56) References Cited

U.S. PATENT DOCUMENTS 9,431,968 B2 * 8/2016 Montazer .............. H03F 1/0261

OTHER PUBLICATIONS

Ryu et al., "CMOS Doherty Amplifier with Variable Balun Transformer and Adaptive Bias Control for Wireless LAN Application," IEEE Journal of Solid-State Circuits, Jun. 2014, 1356-1365, vol. 49, No. 6.

* cited by examiner

WIDEBAND ADAPTIVE BIAS CIRCUITS FOR POWER AMPLIFIERS

BACKGROUND

Power efficiency for wireless portable battery-powered devices under a variety of loading conditions is important for extending battery life in such devices. Power amplifiers are often the most power-consuming components in a wireless portable device, and thus their efficiency contributes substantially to the overall power efficiency of the device. Adaptive biasing is a technique that is often deployed in circuit design to obtain a desired amplifier transfer function as a function of its input signal. The adaptive biasing technique tracks the power demands of the system and provides an appropriate gate bias for the amplifier transistors to achieve the desired transfer function and improve the efficiency of the amplifier.

SUMMARY

Some embodiments relate to an adaptive bias circuit. The adaptive bias circuit comprises a first detector circuit configured to output a first current based on an input power, wherein the first detector circuit is configured to clamp the first current at a first input power level and a second detector circuit configured to output a second current based on the input power, wherein the second detector circuit is configured to clamp the second current at a second input power level lower than the first input power level. The first detector circuit and the second detector circuit are arranged to provide an output current that subtracts the second current from the first current.

Some embodiments relate to an adaptive bias circuit, comprising a detector circuit configured to output a first current based on an input power, a first MOSFET, and a coupling circuit arranged between the detector circuit and a drain terminal of the first MOSFET, wherein the coupling circuit is configured to clamp a current flowing through the first MOSFET above a predetermined input power level detected by the detector circuit.

Some embodiments relate to an adaptive bias circuit, comprising a detector circuit configured to provide a first current at its output based on an input power, a buffer arranged between the output of the detector circuit and an output node of the adaptive bias circuit, and a clamping device configured to provide clamping of an output current provided at the output node of the adaptive bias circuit.

Some embodiments relate to an adaptive bias circuit, comprising a first detector circuit configured to output a first current based on an input power, wherein the first detector circuit is configured to clamp the first current at a first input power level, a second detector circuit configured to output a second current based on the input power, wherein the second detector circuit is configured to clamp the second current at a second input power level lower than the first input power level, wherein the first detector circuit and the second detector circuit are arranged to provide an output current that subtracts the second current from the first current at a node of the adaptive bias circuit, and a tuning circuit configured to tune a transfer function of the output current.

The foregoing summary is provided by way of illustration and is not intended to be limiting.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings.

DETAILED DESCRIPTION

Figure 1A:
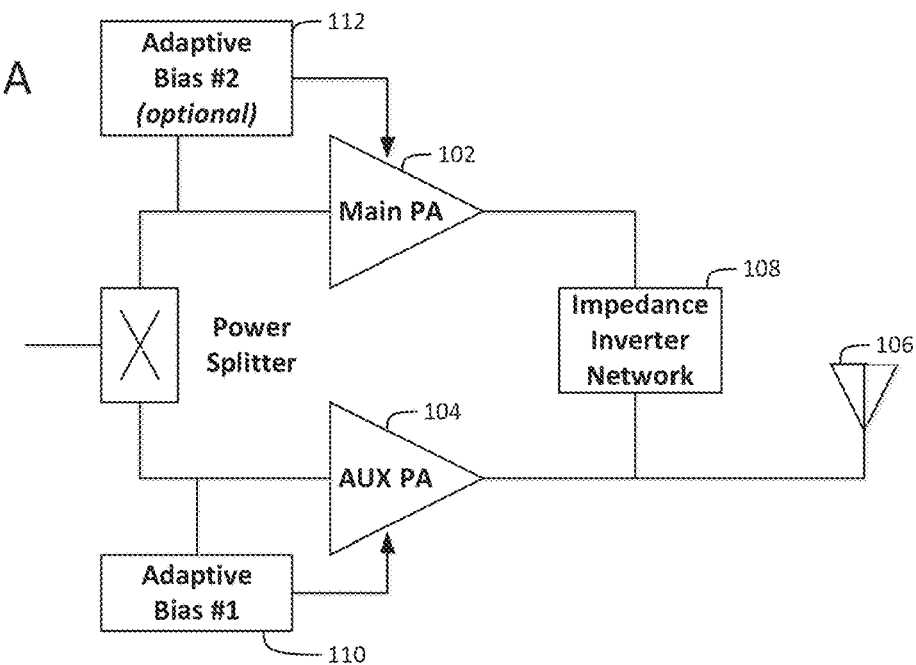
FIG. 1A shows a schematic of a Doherty Amplifier that includes one or more power amplifiers to which the adaptive biasing techniques described herein may be applied, in accordance with some embodiments.

The inventors have recognized and appreciated that existing techniques and circuitry for providing adaptive biasing to amplifiers may be improved. A class of circuits that uses adaptive biasing is power amplifiers, such as the Doherty Amplifier shown in FIG. 1A. The Doherty Amplifier includes a main power amplifier 102 (main PA 102, also referred to as a "carrier amplifier") and an auxiliary power amplifier 104 (aux PA 104, also referred to as a "peaking amplifier") arranged in parallel. The outputs of the main PA 102 and aux PA 104 are combined at antenna 106. Impedance inverter network 108 is arranged across the outputs of main PA 102 and aux PA 104 to provide impendence matching. Adaptive bias circuit 110 is arranged to detect the power at the input of aux PA 104 and to provide a desired bias voltage transfer function in accordance with the techniques described herein for providing adaptive biasing. Adaptive bias circuit 112 is optional and is arranged to detect the power at the input of main PA 104 and to provide a desired bias voltage transfer function. In embodiments that include both adaptive bias circuit 110 and adaptive bias circuit 112, the adaptive bias circuits may have the same configuration or different configurations.

Figure 1B:
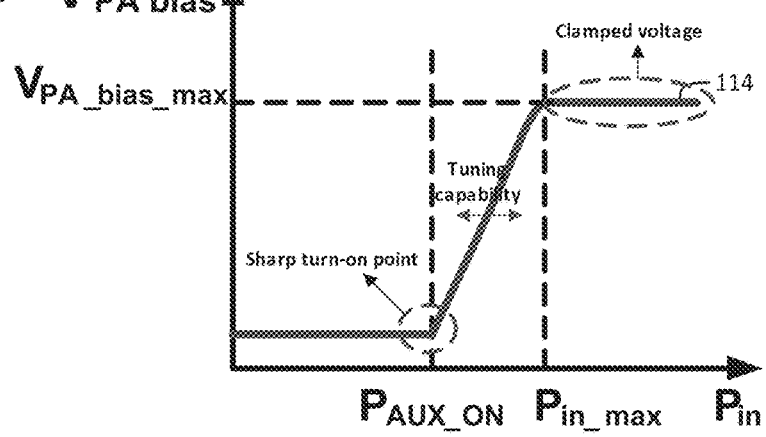
FIG. 1B shows a desired voltage transfer function for an auxiliary power amplifier of the Doherty Amplifier of FIG. 1A.

Inclusion of aux PA 104 improves the efficiency of the Doherty Amplifier by selectively turning on aux PA 104 based on the input power $P_{in}$ of aux PA 104. In operation, the aux PA 104 is off when $P_{in} < P_{AUX\_ON}$ and ramps up rapidly when $P_{in} > P_{AUX\_ON}$. After the input power reaches a maximum level (i.e., $P_{in} > P_{in\_max}$), it is desirable to clamp the bias provided by adaptive bias circuit 110 to prevent excessive current draw. FIG. 1B illustrates this desired "ideal" adaptive bias voltage transfer function (curve 114) provided by adaptive bias circuit 110. To reduce the memory effect in its respective power amplifier (e.g., aux PA 104 for adaptive bias circuit 110), it is preferable that the adaptive bias circuit provide low output impedance over a wide bandwidth.

The inventors have recognized and appreciated that limitations of existing adaptive bias circuits prevent such circuits from providing voltage transfer function characteristics that match the desired voltage transfer function 114 shown in FIG. 1B. As shown, the desired voltage transfer function 114 includes multiple segments. When the input voltage $P_{in} < P_{AUX\_ON}$, the adaptive bias circuit is off. When $P_{in} = P_{AUX\_ON}$, desired voltage transfer function 114 has a sharp turn-on point. When $P_{AUX\_ON} < P_{in} < P_{in\_max}$, the bias voltage increases linearly to a maximum voltage $V_{PA\_bias\_max}$ after which the voltage is clamped for further increases in the input voltage $V_{in}$. As discussed in further detail below, some embodiments are directed to techniques and adaptive bias circuitry for more closely approximating one or more of the desired voltage transfer function 114 characteristics labeled as sharp turn on, turning capability, and clamped voltage in FIG. 1B.

Figure 1C:
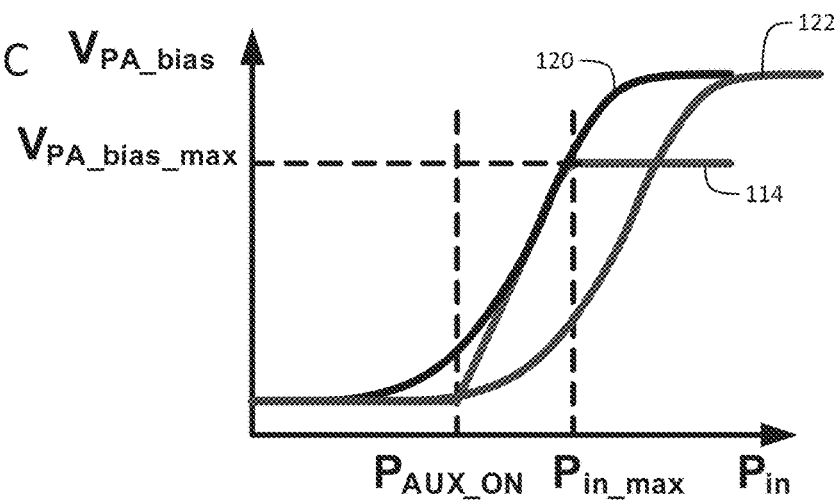
FIG. 1C shows the desired transfer function of FIG. 1B and two comparison transfer functions.

Some conventional adaptive bias circuits use an envelope detector implemented with a pair of NMOS transistors biased in the sub-threshold region to rectify an RF input signal. Due to the square law nature of CMOS devices, the output voltage of the envelope detector rises gradually at $P_{in} = P_{AUX\_ON}$ as the RF input power increases. Unlike the sharp turn on characteristic of the desired voltage transfer characteristic (curve 114 in FIG. 1C), the gradual rise in output voltage for some existing adaptive bias circuits results in either extra power consumption from the power amplifier when $P_{in} < P_{AUX\_ON}$ (curve 120 in FIG. 1C) or slow turn-on of the power amplifier at $P_{in} > P_{AUX\_ON}$ (curve 122 in FIG. 1C). Additionally, as shown in FIG. 1C, after the input power has reached a maximum power level ($P_{in\_max}$) the bias of the desired power transfer characteristic is clamped to $V_{PA\_bias\_max}$. Some existing adaptive circuits do not provide such clamping. For example, as shown in FIG. 1C, the bias voltage continues to rise even after the input power $P_{in}$ exceeds the maximum power level $P_{in\_max}$ and until the NMOS pair gets pushed into triode region. The resultant excessive current draw above $P_{in\_max}$ decreases the efficiency of the power amplifier.

Some other existing circuits for providing adaptive biasing to a power amplifier improve amplifier efficiency at backed-off power levels with an adaptive gate bias in a common gate (cascode) stage of the auxiliary amplifier. However, such circuits involve design tradeoffs between the auxiliary amplifier and the desired bias curve, they don't allow for tuning of the bias curve, and they do not provide the output clamping functionality discussed above in connection with FIG. 1C.

Some embodiments described herein are directed to techniques and circuits for providing clamping in an adaptive bias circuit to achieve a desired voltage transfer function (e.g., transfer function 114 shown in FIGS. 1B and 1C). A first type of clamping in accordance with some embodiments, provides for a sharp-turn on by generating a constant low-voltage bias independent of input power, when the input power is less than $P_{AUX\_ON}$. A second type of clamping generates a constant saturation voltage bias independent of input power when the input power is higher than a threshold value, $P_{in\_max}$. Additionally, some embodiments provide for tuning of the bias voltage transfer function to achieve a desired bias transfer function characteristic, as discussed in more detail below.

Figure 2B:
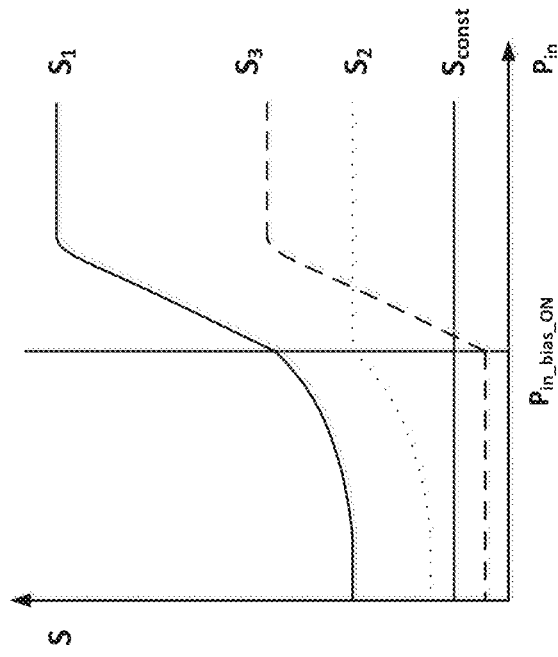
FIG. 2B shows simulated response curves for the inputs and outputs of the clamping technique of FIG. 2A.
Figure 2A:
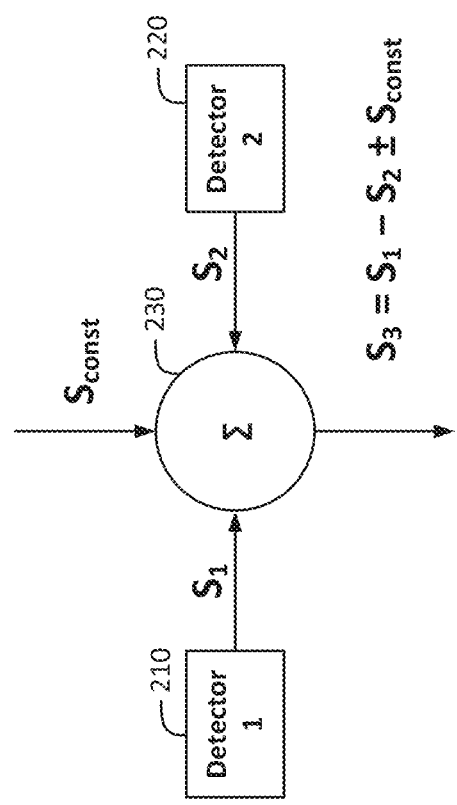
FIG. 2A conceptually illustrates a clamping technique for providing a sharp turn on characteristic in accordance with some embodiments.

FIG. 2A conceptually illustrates a subtraction technique for providing wideband adaptive biasing with a sharp turn on when $P_{in} > P_{in\_bias\_ON}$ in accordance with some embodiments. The inventors have recognized and appreciated that by subtracting the output signal from multiple detectors with different voltage transfer functions, sharp turn on at a particular input power (e.g., $P_{in\_bias\_ON}$) can be achieved. As shown in FIG. 2A, a desired output signal $S_3$ is achieved using a summing element 230 that subtracts, from the output signal $S_1$ of a first detector 210 having a first voltage transfer function, the output signal $S_2$ of a second detector 220 having a second voltage transfer function that is different from the first voltage transfer function. As shown in FIG. 2B, detector 210 and detector 220 may have similar response characteristics except that detector 220 is clamped at a lower input power $P_{in\_bias\_ON}$ compared to detector 210. To obtain a sharp turn on at $P_{in\_bias\_ON}$, signal $S_2$ output from second detector 220 is subtracted from signal $S_1$ output from detector 210. A constant signal $S_{const}$ may be added or subtracted to generate a desired offset for signal $S_3$.

Figure 2C:
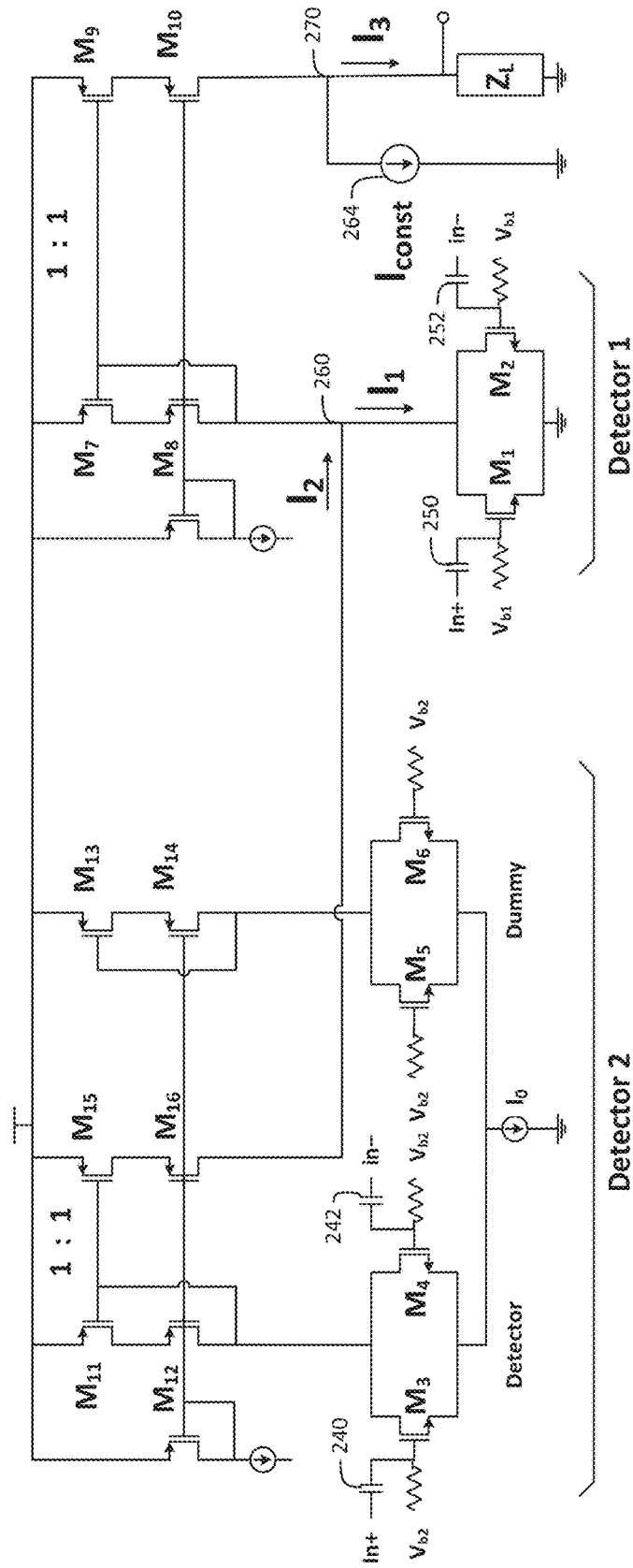
FIG. 2C illustrates a circuit implementation of the clamping of FIG. 2A.

FIG. 2C shows a circuit implementation of the signal subtraction technique for providing sharp turn on, as discussed in connection with FIGS. 2A and 2B. Transistors $M_5$, $M_6$, $M_{13}$, and $M_{14}$ form a replica of transistors $M_3$, $M_4$, $M_{11}$, and $M_{12}$. Transistors $M_{11}$, $M_{12}$, $M_{15}$, and $M_{16}$ form a 1:1 current mirror. The input power value at which the current $I_2$ output from detector 2 (corresponding to detector 220 in FIG. 2A) is clamped is set based on the values of coupling capacitors 240, 242, which receive the inputs In+ and In−. Current sink $I_0$ operates to limit the maximum available current $I_2$ ($I_2 < I_0$) in detector 2. As a result, detector 2 generates a current $I_2$, which is clamped at a lower input power $P_{in\_bias\_ON}$ with zero-input-power value as $I_0/2$ and maximum value as $I_0$. As shown, the output of detector 1 (corresponding to detector 210 in FIG. 2A) is current $I_1$. The input power value at which the current $I_1$ is clamped is set based on the values of coupling capacitors 250, 252, which also receive inputs In+ and In−. The current $I_2$ output from detector 2 is subtracted from the current $I_1$ output from detector 1 at node 260. Transistors $M_7$, $M_8$, $M_9$, and $M_{10}$ form another 1:1 current mirror. A current source 264 provides a constant current $I_{const}$ at node 270. Accordingly, at node 270, the current $I_3$ is equal to the current at node 260 (i.e., $I_1 - I_2$) minus the constant current $I_{const}$ to provide the desired relation described in connection with FIG. 2A. In the implementation shown in FIG. 2C, all transistors may remain active across all input power levels, which allows for a sharp turn on characteristic of the bias voltage transfer function over a wide modulation signal bandwidth.

Figure 3A:
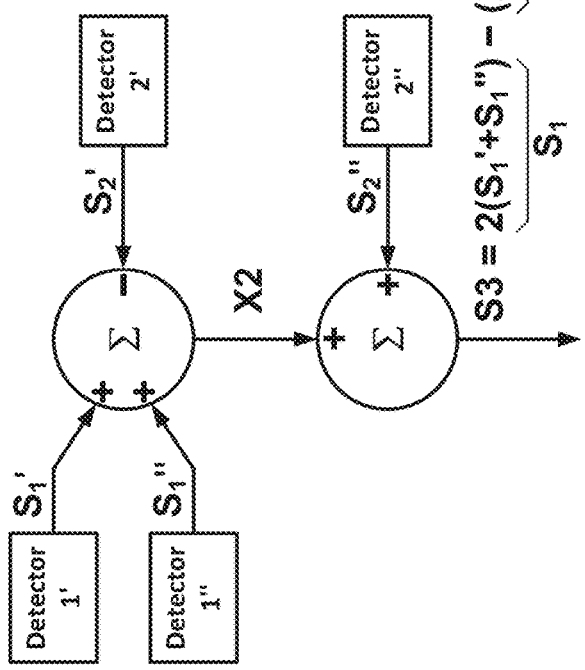
FIG. 3A conceptually illustrates an alternate clamping technique for providing a sharp turn on characteristic in accordance with some embodiments.
Figure 3B:
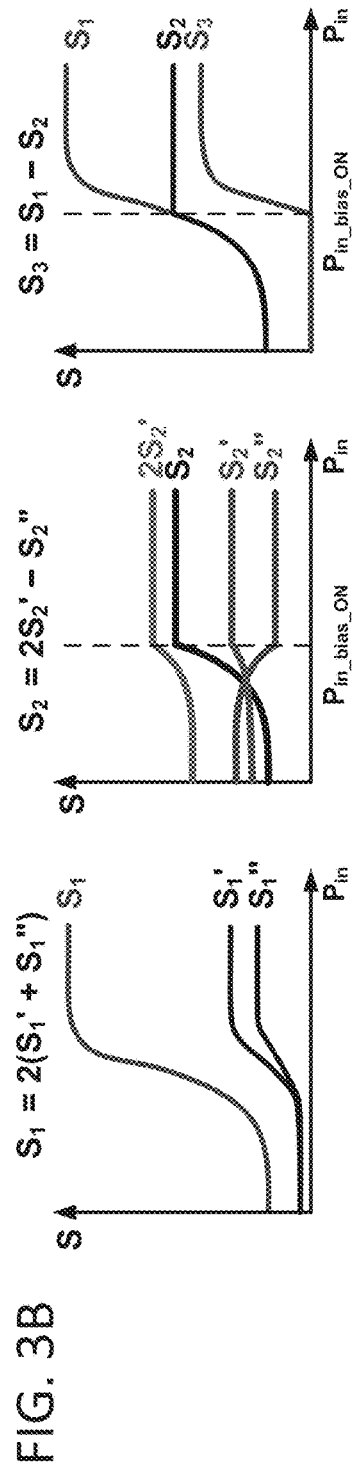
FIG. 3B shows simulated response curves for the inputs and outputs of the clamping technique of FIG. 3A.

FIG. 3A shows a more general implementation of the signal subtraction technique described in connection with FIGS. 2A and 2B, where signals $S_1$ and $S_2$ result from algorithmic operations of the outputs from multiple detectors. For example, as shown in FIG. 3A, $S_1 = 2(S_1' + S_1'')$, $S_2 = 2S_2' + S_2''$ and $S_{const} = 0$. The response curves for the example algorithmic operations shown in FIG. 3A are illustrated in FIG. 3B. A circuit implementation for providing the signals $S_1'$, $S_1''$, $S_2'$, $S_2''$ may use circuit elements (e.g., current mirrors, coupling capacitors, etc.) and techniques (e.g., subtraction of currents at particular nodes) similar to those described for FIG. 2C or any other suitable techniques to achieve the desired signals. It should be appreciated that any suitable algorithmic operations may be used to achieve a desired output signal $S_3$, and embodiments are not limited in this respect.

Figures 4A, 4B:
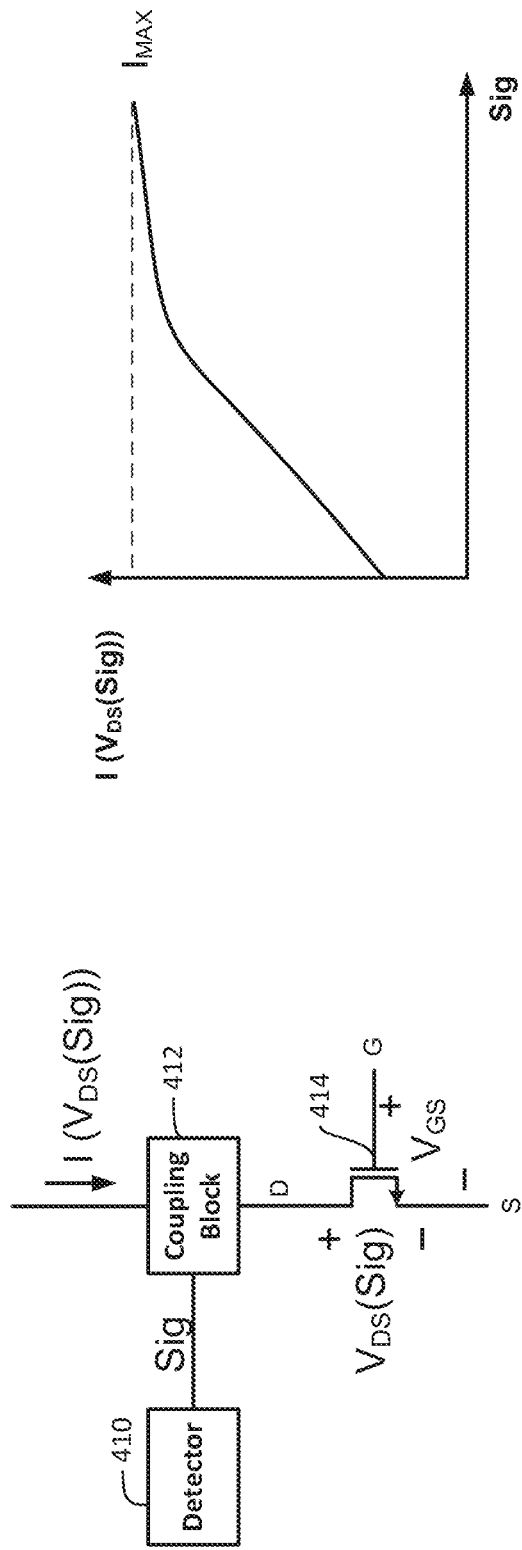
FIG. 4A conceptually illustrates a clamping technique for providing a constant voltage bias when the input power exceeds a threshold value in accordance with some embodiments.
FIG. 4B shows a simulated response curve for the clamping technique of FIG. 4A.

As discussed above, in addition to providing a sharp turn on when $P_{in} > P_{in\_bias\_ON}$, another bias voltage transfer function characteristic that is desirable to increase the efficiency of the power amplifier is to clamp the bias current when the input power reaches a certain maximum power level. In accordance with some embodiments, current clamping is achieved by using the device characteristics of a MOSFET by driving the MOSFET into the saturation region from the triode (linear) region as $P_{in}$ increases. FIG. 4A schematically illustrates this concept. The output of detector 410 is provided to a coupling block 412, which couples the signal generated by detector 410 to $|V_{DS}|$ of a MOSFET 414. As $|V_{DS}|$ becomes large enough to pull the MOSFET into the saturation region, it drain current will be clamped at $I_{MAX}$ with an further increase in $|V_{DS}|$, neglecting second order effects, such as the MOSFET channel length modulation effect. Accordingly, $I(V_{DS}(Sig))$ is clamped to a maximum value when Sig (i.e., the output of detector 410) becomes either too large or too small depending on positive or negative coupling. FIG. 4B illustrates a response curve when the coupling is positive, showing that $I(V_{DS}(Sig))$ is clamped to the value of $I_{MAX}$ due to the positive coupling introduced by coupling block 412. In some embodiments, the MOSFET 414 remains active across the entire input power range, thereby providing a wideband clamping circuit.

Figures 5A, 5B:
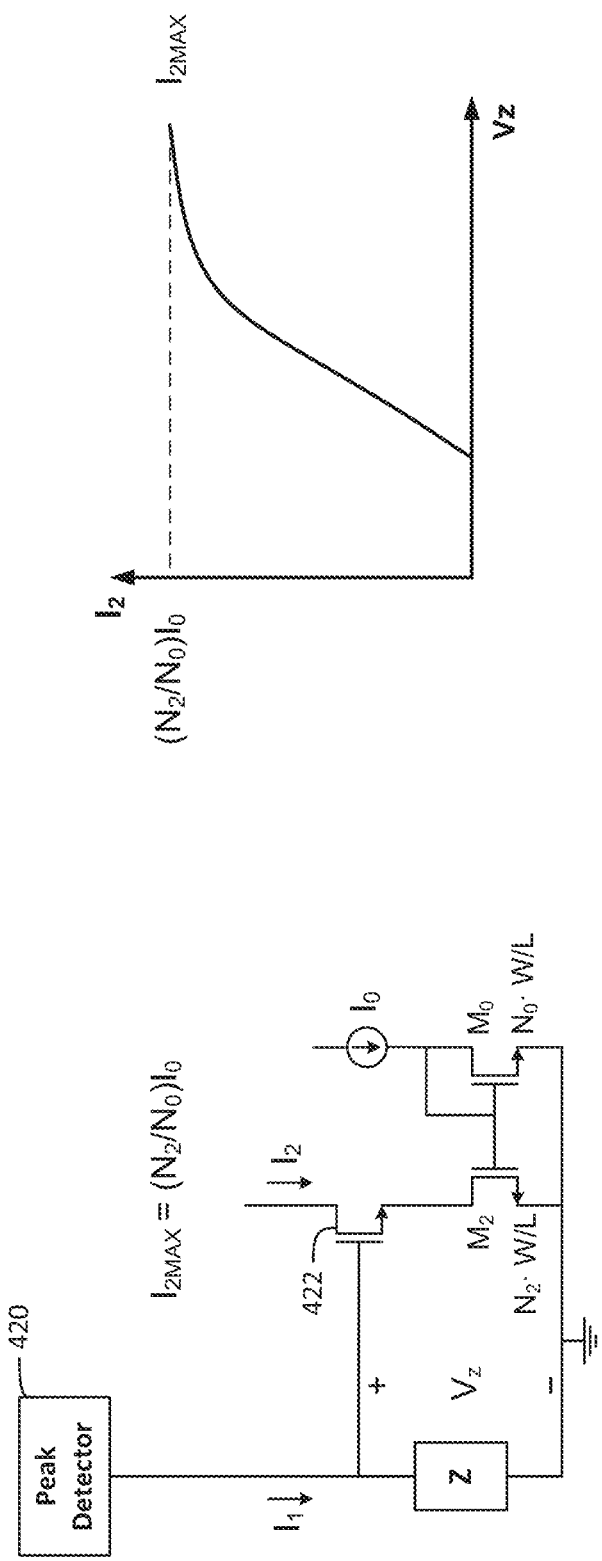
FIG. 5A illustrates a circuit implementation of the clamping technique of FIG. 4A.
FIG. 5B shows a response curve for the circuit implementation of FIG. 5A.

FIG. 5A shows a circuit implementation of the clamping concept described in connection with FIGS. 4A and 4B. As discussed above, the objective of the clamping circuit is to clamp the current $I_1$ output from detector 420 at a maximum value for input power levels above a certain cutoff to increase the efficiency of a power amplifier to which the adaptive bias circuit is providing gate bias to the transistors in the power amplifier. As shown, a voltage $V_z$ is generated across a load Z due to output current $I_1$. Accordingly, as $I_1$ increases, $V_z$ also increases, which in turn increases the gate voltage of transistor 422. Transistor $M_2$ is initially biased in its triode region. However, as $I_1$ and $V_z$ increase, the current $I_2$ flowing through transistor 422 also increases since $V_{DS}$ of transistor $M_2$ increases. When $V_{DS}$ of transistor $M_2$ exceeds a particular voltage due to continued increases in $V_z$, transistor $M_2$ is pulled into its saturation region, and $I_2$ reaches a maximum value of $(N_2/N_0)/I_0$ and will remain clamped at this value for further increases in $I_1$ and $V_z$. Accordingly, by pulling the transistor $M_2$ from triode mode into its saturation region, the current $I_2$ is limited by the current source $I_0$ and has a maximum value that is based on the characteristics of the transistors $M_0$ and $M_2$. FIG. 5B shows the response curve generated using the current clamping circuit of FIG. 5A. As shown in FIG. 5B, the current $I_2$ is clamped at $(N_2/N_0)I_0$ for values of $V_z$ above a particular voltage.

Figures 6A, 6B:
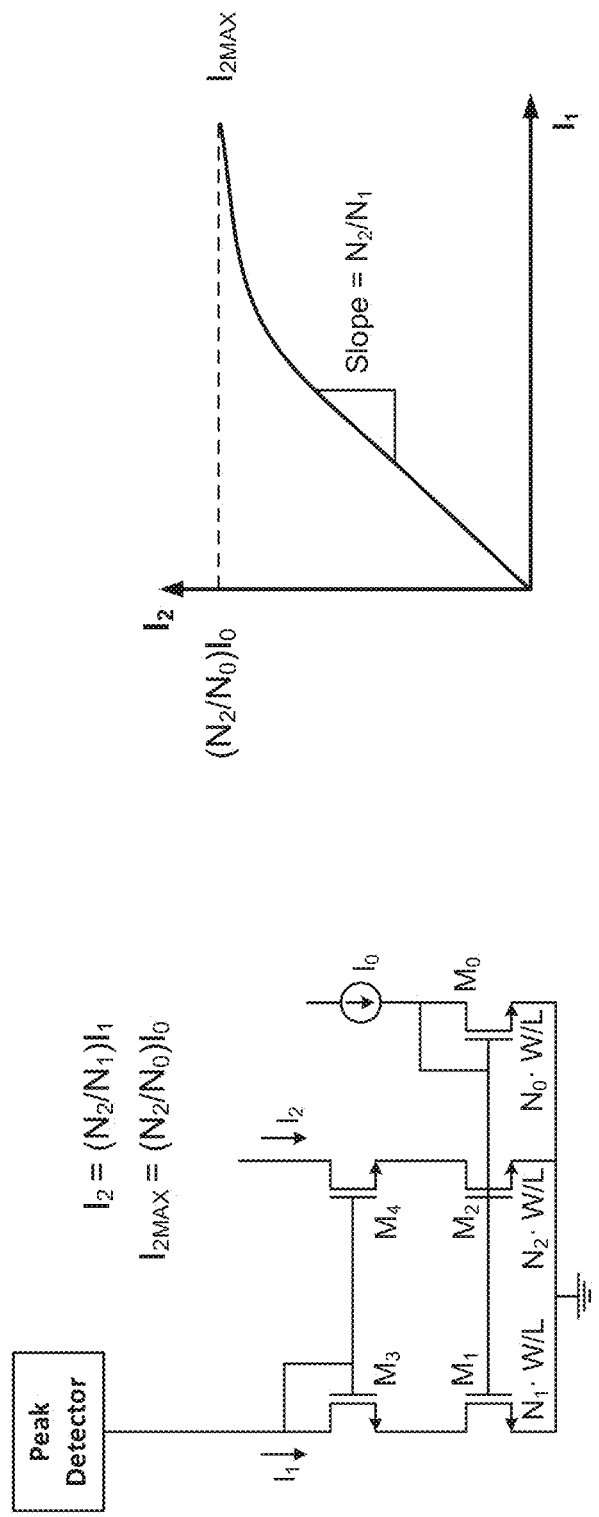
FIG. 6A illustrates an alternate circuit implementation of the clamping technique of FIG. 4A.
FIG. 6B shows a response curve for the circuit implementation of FIG. 6A.

As discussed above, some embodiments are directed to providing a bias voltage transfer function that is similar to an "ideal" transfer function, such as the transfer function shown in FIG. 1B. In addition to providing a sharp turn on and clamping, the inventors have recognized and appreciated that it would be advantageous to be able to adjust the slope of the transfer function to more closely approximate the slope of a desired transfer function. FIG. 6A illustrates a modification to the circuit implementation of FIG. 5A in which the load Z is replaced by transistors $M_1$ and $M_3$. The circuit implementation of FIG. 6B provides for tuning of the slope of the bias voltage transfer function as shown in FIG. 6B. In operation, when $I_2$ is small enough such that transistors $M_1$ and $M_2$ both operate in their triode region, $I_2$ is equal to $(N_2/N_1)I_1$. However, when $I_1$ increases sufficiently to pull transistors $M_1$ and $M_1$ from the triode region into the saturation region, $I_2$ will be clamped at a maximum current of $(N_2/N_0)I_0$, as described above in connection with the circuit implementation of FIG. 5A. Accordingly, by adjusting the characteristics of transistors $M_1$ and $M_2$, the slope $(N_2/N_1)$ of the bias voltage transfer function can be set as desired.

Figure 7B:
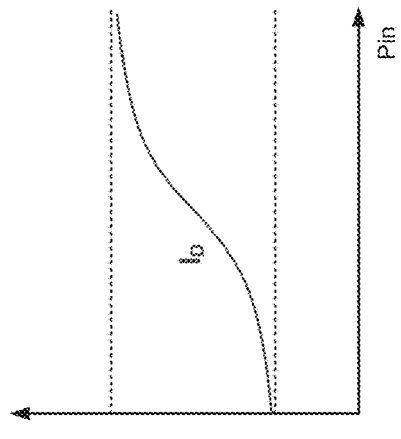
FIG. 7B shows a response curve for the circuit implementation of FIG. 7A.
Figure 7A:
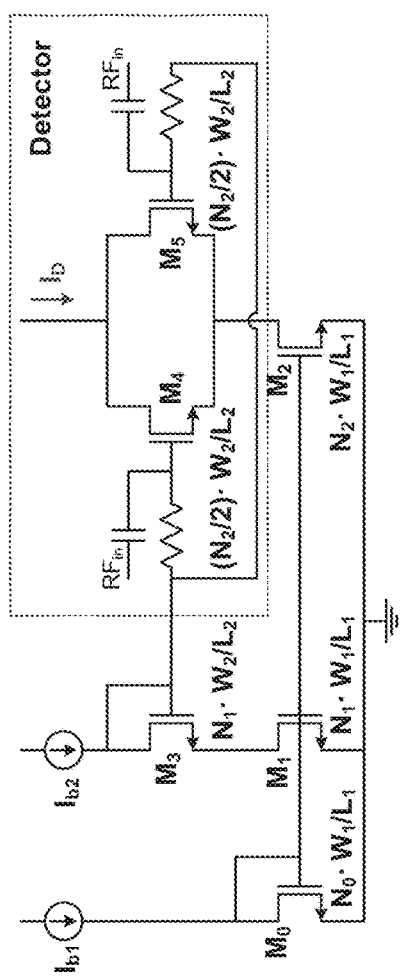
FIG. 7A illustrates an alternate circuit implementation of the clamping technique of FIG. 4A.

FIG. 7A illustrates yet another circuit implementation of an adaptive bias circuit for providing clamping in accordance with some embodiments. The circuit implementation in FIG. 7A is similar to that in FIG. 6A, with the detector branch and the $I_0$ (shown as $I_{b1}$ in FIG. 7A) being switched in orientation relative to the middle $I_2$ (shown as $I_{b2}$ in FIG. 7A) branch. The detector branch has been further expanded to show a circuit implementation of the detector similar to that described above in connection with FIG. 2A, where the detector includes coupling capacitors at the RF inputs. For the circuit implementation of FIG. 7A, in operation when the current $I_D$ is small enough to keep transistor $M_2$ operating in its triode region, $I_D = (N_2/N_1)/I_{b2}$. As the input power increases, $I_D$ also increases. When the input power rises to a level that pulls transistor $M_2$ into its saturation region, $I_D$ will be clamped at its maximum value of $(N_2/N_0)/I_{b1}$. FIG. 7B illustrates the response curve of the circuit implementation of FIG. 7A described above.

Figure 8B:
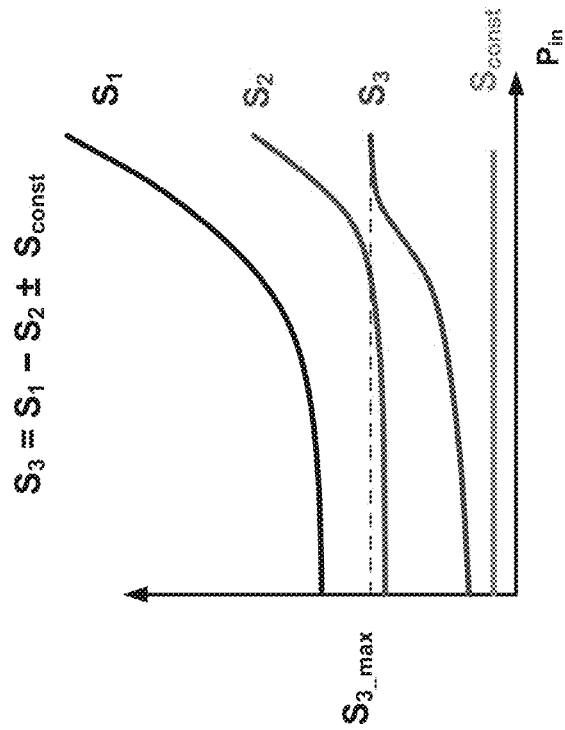
FIG. 8B shows simulated response curves for the clamping technique of FIG. 8A.
Figure 8A:
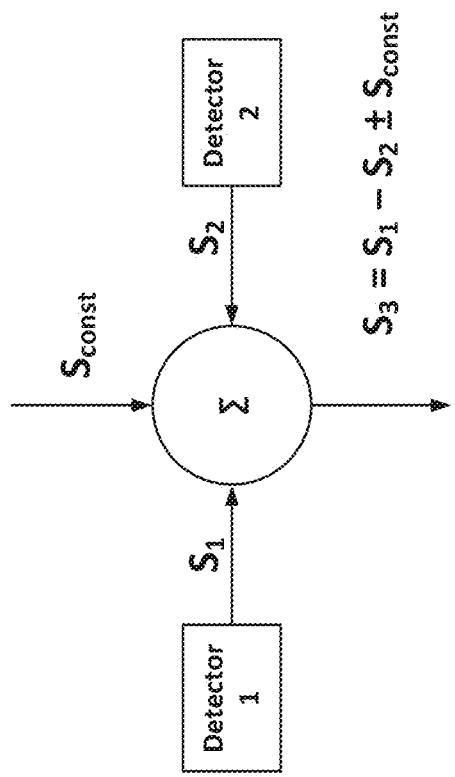
FIG. 8A conceptually illustrates a clamping technique for providing a constant voltage bias when the input power exceeds a threshold value in accordance with some embodiments.

The inventors have recognized and appreciated that the subtraction technique described above in connection with FIGS. 2A and 2B for providing sharp turn on may also be used to provide clamping in accordance with some embodiments. FIG. 8A conceptually illustrates the subtraction technique, which is identical to the conceptual description shown in FIG. 2A and discussed above. The two detectors can have different onset points with detector 1 (D1) having a lower power onset point (i.e., it can detect at lower power). When the input power is higher than the D1 onset point, for the same power, the D1 output signal is higher than that from the detector 2 (D2), which has a higher power onset point. Consequently, when the output signal (S2) from D2 is subtracted from the output signal (S1) of D1, the corresponding signal (S3) response curve exhibits a slope between the power onset points of the two detectors. When the input power is very low or very high the response curve of S3 exhibits a constant value, as shown in FIG. 8B. The output curve S3 can be shifted up or down by adjusting the constant signal value $S_{const}$ provided to the integrating element.

Figure 8C:
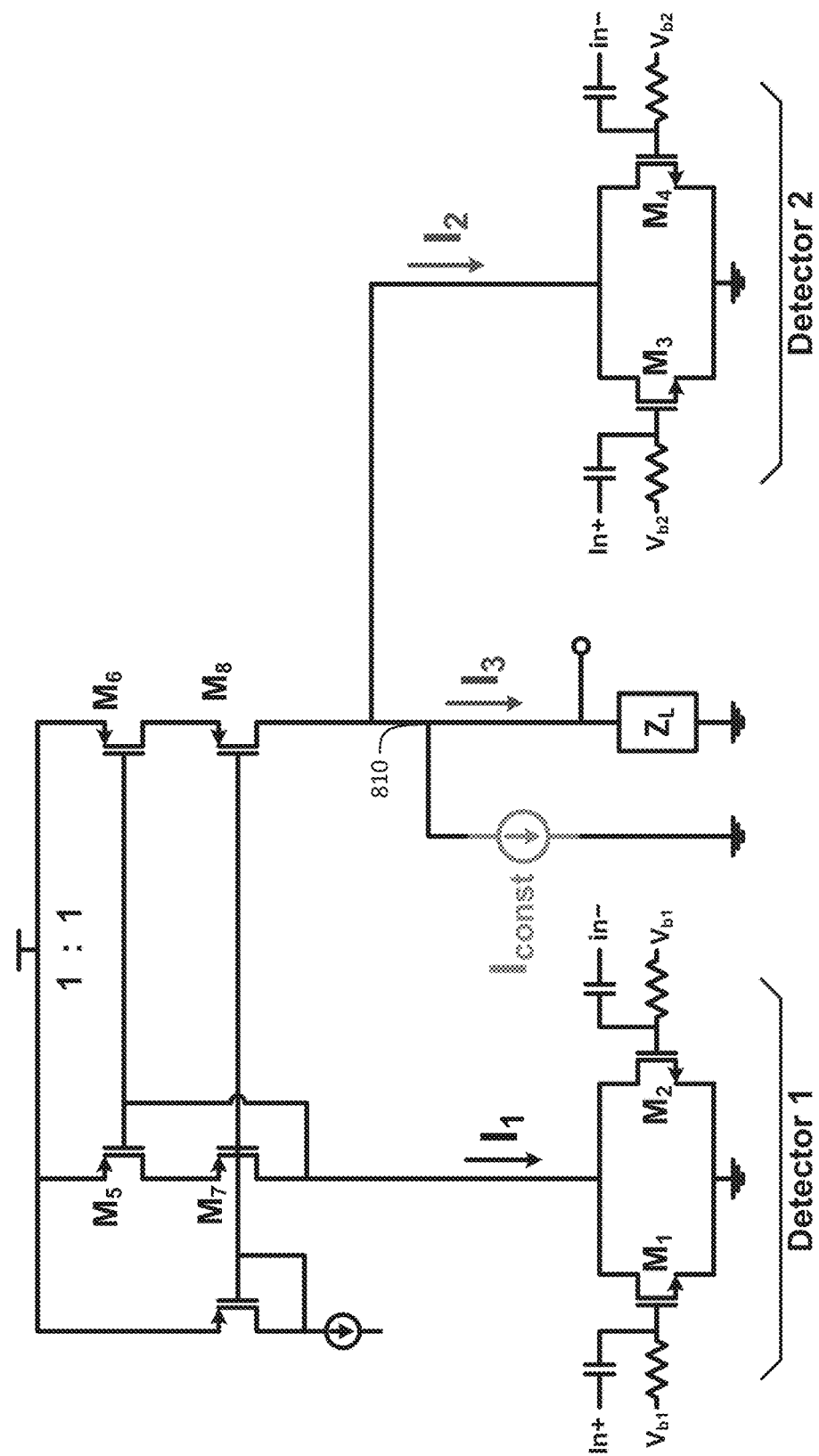
FIG. 8C illustrates a circuit implementation of the clamping technique of FIG. 8A.

FIG. 8C illustrates a circuit implementation of the use of a subtraction technique to achieve current clamping in accordance with some embodiments. Detector 1 includes a pair of transistors $M_1$ and $M_2$ arranged in the same configuration as the left portion of detector 2 as shown in FIG. 2C including the use of coupling capacitors connected at the RF inputs. Detector 2 includes a pair of transistors $M_3$ and $M_4$ arranged in the same configuration as the transistors in detector 1. Detector 2 also includes coupling capacitors connected to the RF inputs. Adjustment of the coupling capacitors for each of detectors 1 and 2 changes the response characteristics of the currents $I_1$ and $I_2$ output from the respective detectors. The current $I_1$ output from detector 1 is mirrored to node 810 via a 1:1 current mirror circuit that includes transistors $M_5$, $M_6$, $M_7$, and $M_8$. Accordingly, node 810 operates as the integrating element at which the subtraction of the output currents from the two detectors occurs. In particular, the current $I_3$ output from node 810 is equal to $I_1-I_2-I_{const}$ to achieve the desired result discussed in connection with FIGS. 8A and 8B. The MOSFETs illustrated in FIG. 8C may remain active across the entire input power range providing a wideband clamping circuit in accordance with some embodiments.

As discussed above, some embodiments achieve clamping by using MOSFET device characteristics to pull the device from the triode region into the saturation to effect clamping. Other embodiments employ a subtraction technique to subtract the outputs from multiple detectors to achieve clamping at an output node of the clamping circuit. The inventors have recognized and appreciated that other techniques for providing clamping may use circuit devices including, but not limited to, diodes, stacked diodes, diode-connected MOSFETs, and diode-connected bipolar junction transistors (BJTs). Such devices are characterized as having a current-voltage (I-V) transfer function that is comparable or sharper than the square law I-V transfer function of MOSFET devices. Therefore, further increasing the detector output current above $P_{in\_max}$ results in negligible bias voltage increases.

Figure 9A:
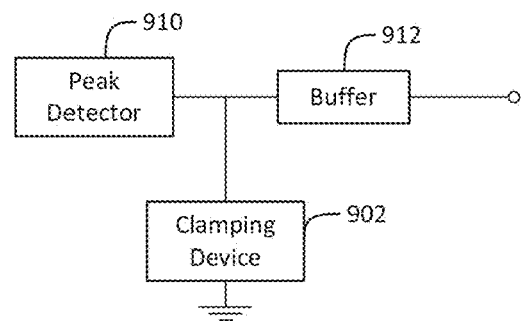
FIGS. 9A and 9B show schematic block diagrams for providing clamping for providing a constant voltage bias when the input power exceeds a threshold value in accordance with some embodiments.
Figure 9B:
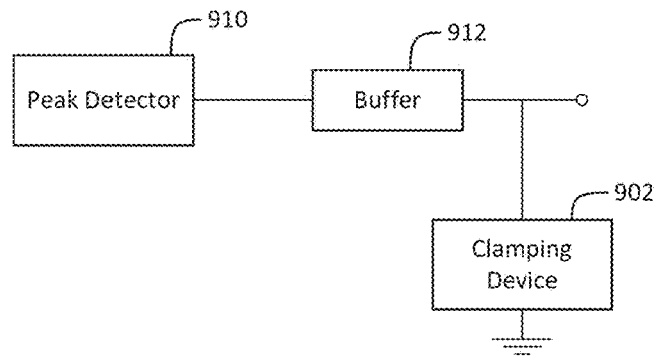

FIGS. 9A and 9B illustrate two alternative arrangements of a clamping circuit that may be used in accordance with some embodiments. As shown in FIG. 9A, clamping device 902 may be arranged between the output of detector 910 and buffer 912 to clamp the output signal based on the characteristics of the clamping device. In the alternative arrangement shown in FIG. 9B, the clamping device 902 is arranged after buffer 912 at the output node. Detector 910 in FIGS. 9A and 9B may be implemented, for example, as a detector described in connection with FIG. 2C or 8C, or as general detector in adaptive bias circuit. To reduce the memory effect in a power amplifier with which some embodiments are used (e.g., main power amplifier 102, auxiliary power amplifier 104), buffer 912 provides a wide bandwidth, low output impedance unity-gain voltage transfer function to bias the power amplifier. Buffer 912 also isolates detector 910 from the power amplifier to provide the desired adaptive bias transfer function independent of the status or circuit topology of the power amplifier. The location of the diode-type clamping cells may be included either at the output of detector 910 (FIG. 9A) or at the output of buffer 912 (FIG. 9B), as the diode-type clamping cells have negligible impact on detector 910 and buffer 912.

Figure 9C:
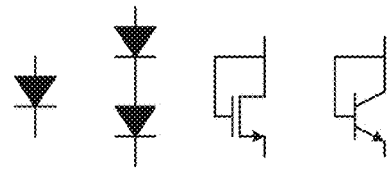
FIG. 9C shows several circuit elements that may be used to provide clamping in accordance with some embodiments.

FIG. 9C shows various circuit elements that may be used as clamping device 902 in accordance with some embodiments including a diode, stacked diodes, a MOSFET, and a bipolar junction transistor. Stacked diodes have the capability to provide different voltage clamping levels required by the power amplifier. It should be appreciated that any suitable circuit element or combination of elements may be used as clamping device 902, and the devices shown in FIG. 9C are provided merely as examples.

Figure 9D:
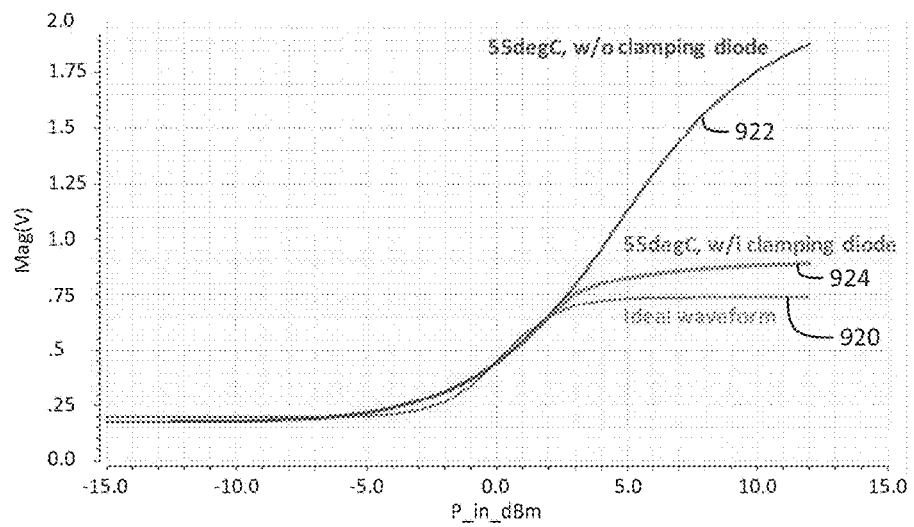
FIG. 9D shows the results of a simulation in which a clamping diode was used as a clamping device in accordance with some embodiments.

FIG. 9D illustrates the results of a simulation that uses a diode as clamping device 902. The ideal bias transfer characteristic is shown as curve 920. Curve 922 illustrates the results of the simulation when no clamping diode is used, and curve 924 illustrates the results of the simulation when a clamping diode is used as clamping device 902. As should be appreciated from the simulation, the use of the clamping diode (curve 924) provides a result that more closely approximates the ideal bias voltage transfer function (curve 920) compared to when the clamping diode is not used (curve 922).

Figures 10A, 10B:
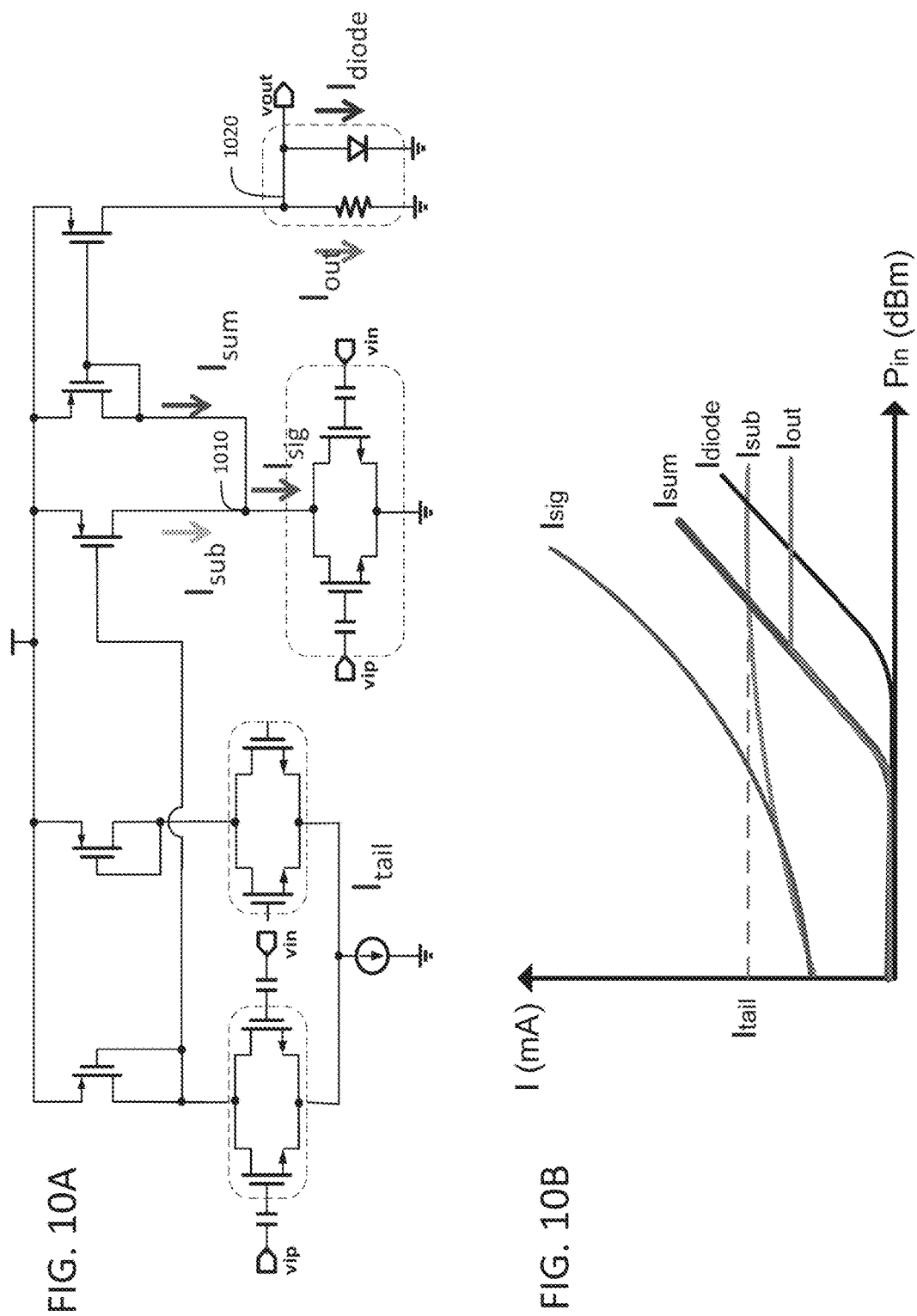
FIG. 10A illustrates a circuit implementation of a diode-based clamping technique in accordance with some embodiments.
FIG. 10B shows simulated response curves for the circuit implementation of FIG. 10A.

FIG. 10A illustrates a circuit implementation to provide current clamping using a diode arranged at the output node to limit the output current based on the turn-on voltage of the diode. The circuit implementation of FIG. 10A includes a subtraction portion having an output current $I_{sub}$, a main signal portion including node 1010, and an output portion that includes node 1020 and a diode clamping device that limits the output current $I_{out}$. As shown in FIG. 10B, the output current $I_{out}$ is equal to the current $I_{sum}$ clamped to a constant current at the turn on voltage of the diode. The current $I_{sum}$ is determined at node 1010 as the subtraction of the currents $I_{sig}$ and $I_{sub}$.

Figure 11A:
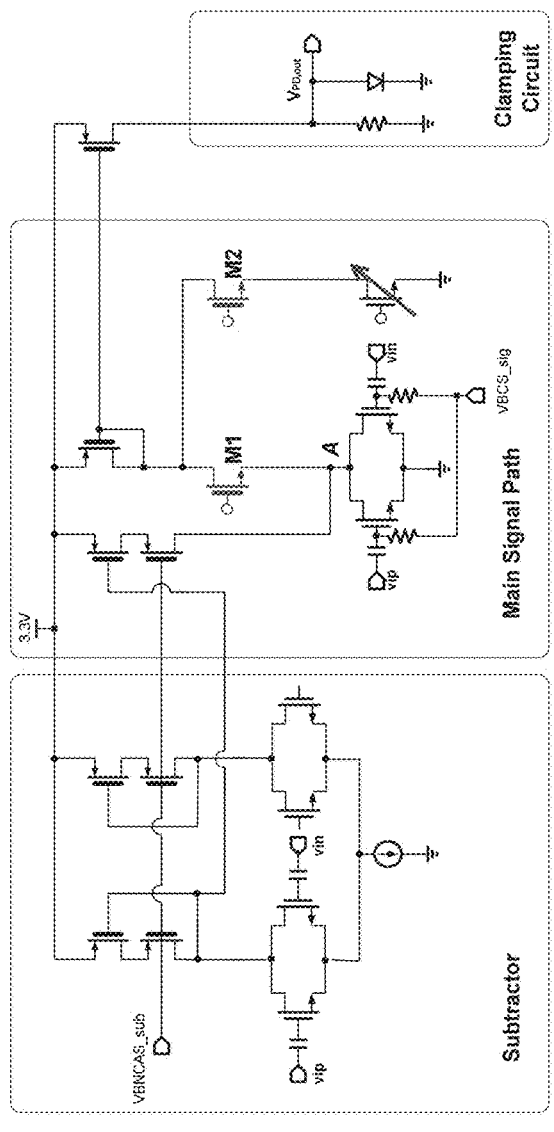
FIG. 11A illustrates a circuit implementation for tuning an amplifier transfer function in accordance with some embodiments.

As discussed above, some embodiments employ circuit-implemented techniques for achieving a bias voltage transfer function similar to a desired or "ideal" transfer function. In some implementations it may be desirable to tune the transfer function to turn on its associated power amplifier earlier or later based on the input power to the adaptive bias circuit. FIG. 11A illustrates a circuit implementation of an adaptive bias circuit that enables for tuning of the transfer curve by adjusting a cascode control voltage in accordance with some embodiments.

Figure 11B:
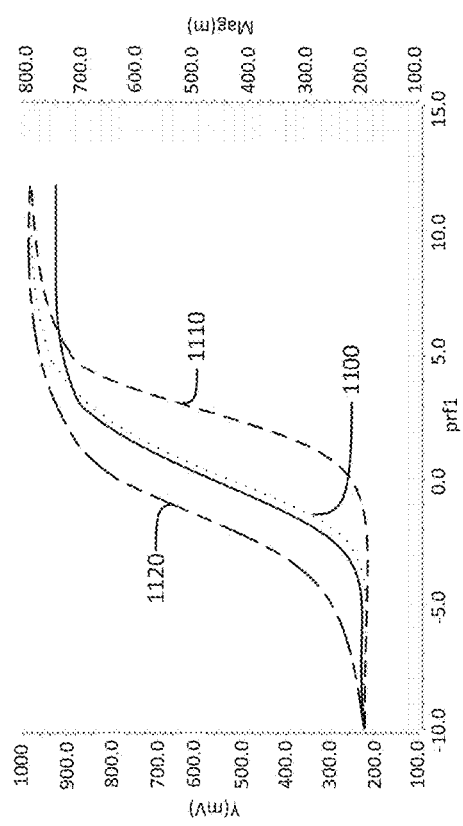
FIG. 11B shows the results of a simulation using the circuit implementation of FIG. 11A.

As shown in FIG. 11A, the cascode devices $M_1$ and $M_2$ of the main signal path are separated instead of using a single MOSFET in the main signal path. The operating conditions of transistors $M_1$ and $M_2$ may be set differently to adjust the tuning of the bias voltage transfer function. In operation, at zero input power, the transistor $M_1$ is turned off, and current only flows through transistor $M_2$, which is operating in its saturation region. Due to the channel length modulation effect of the main signal path's detector, the initial voltage of node A is dynamically set automatically. As the input power increases, transistor $M_1$ transitions from off mode to operate in its saturation region. When this happens, more current flows into the output load resistor and the output voltage of the peak detector increases, thereby providing the adaptive bias functionality as discussed above. Tuning of the bias voltage transfer function is achieved by adjusting the gate bias of the transistor $M_1$. FIG. 11B shows simulation results for applying different gate voltages to the transistor $M_1$ to adjust the tuning of the bias voltage transfer curve, which determines when the adaptive biasing functionally influences the behavior of its associated power amplifier. Tuning of the bias voltage transfer curve 1100 is shown. At lower gate voltages, transistor $M_1$ is turned on later and the bias voltage transfer function is shifted to the right (curve 1110), whereas at higher gate voltages transistor $M_1$ is turned on earlier, the bias voltage transfer function is shifted to the left (curve 1120). It should further be appreciated that the topology shown in FIG. 11 is robust to process variation because the channel length modulation effect on which the technique relies is a dynamic tuning mechanism.

Figure 12:
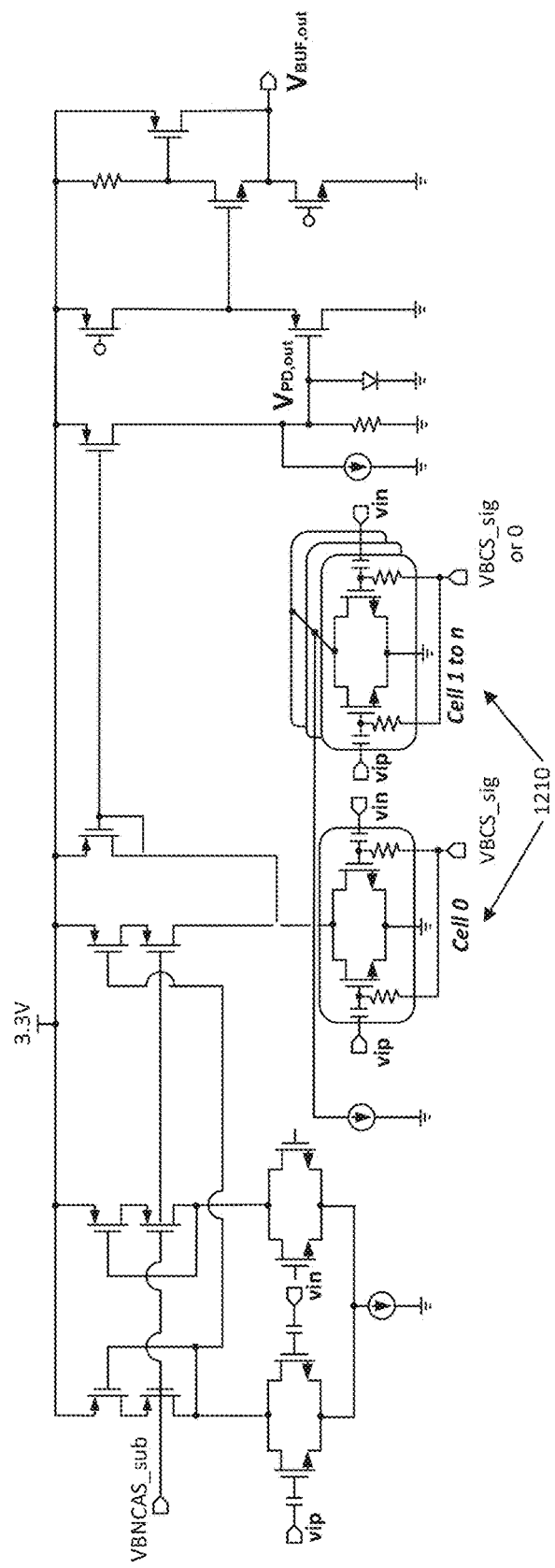
FIG. 12 shows a circuit layout for tuning an amplifier transfer function by including more or fewer detector cells in accordance with some embodiments.

FIG. 12 shows an alternate solution for tuning the bias voltage transfer function in accordance with some embodiments. Rather than changing the gate voltage of transistor $M_1$ as just described, some embodiments turn on additional detector cells 1210 to tune the bias voltage transfer curve. As shown in FIG. 12, any suitable number (e.g., 1 to n) of detector cells 1210 may be used, and embodiments are not limited in this respect.

Figure 13:
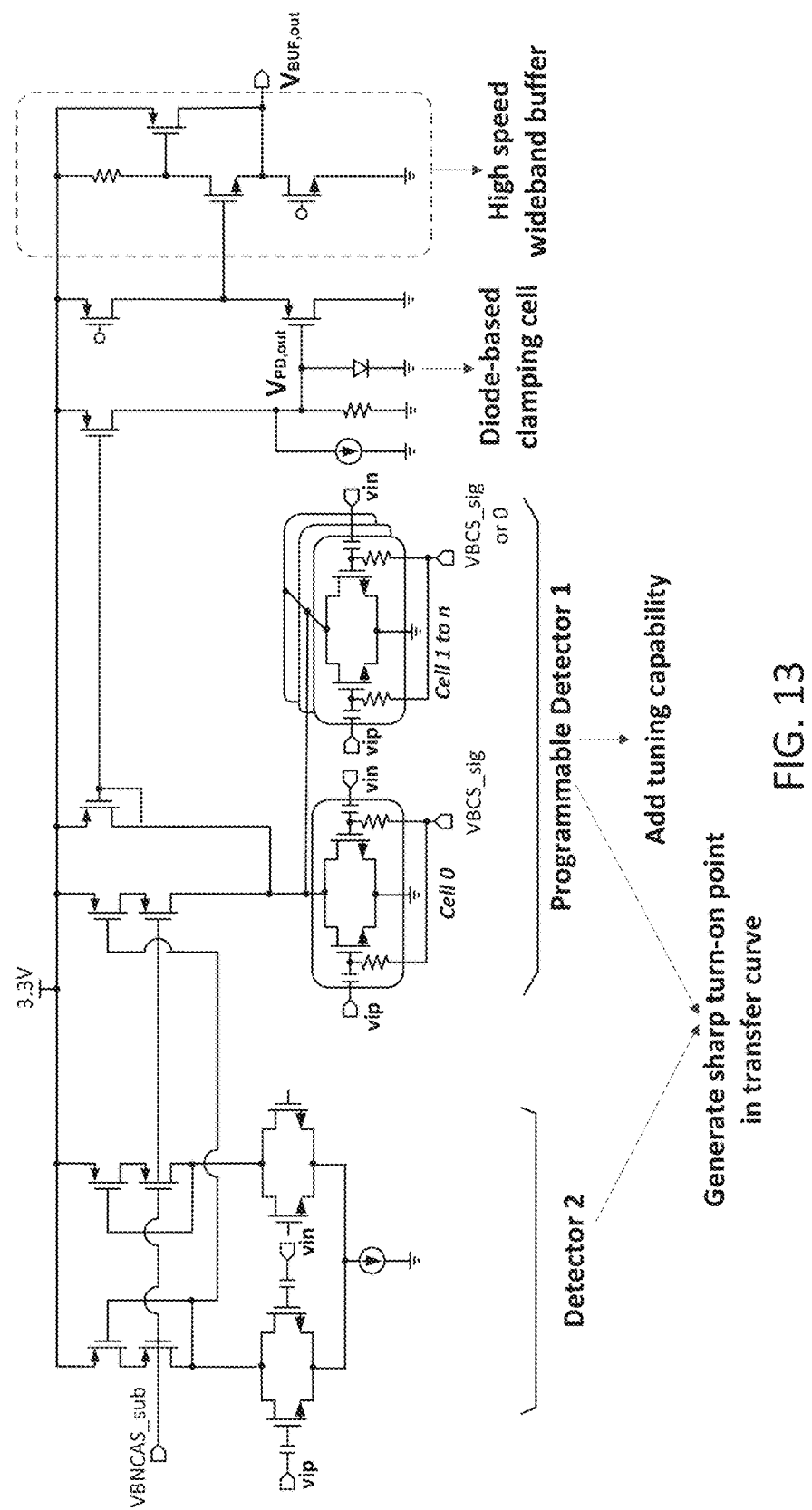
FIG. 13 shows a circuit layout for providing a sharp-turn on characteristic, a tuning capability, and a clamping characteristic for an amplifier transfer function in accordance with some embodiments.

One or more of the techniques described herein for providing circuitry that more closely approximates desired voltage transfer function characteristics for an adaptive bias circuit including sharp turn on, tuning capability, and voltage clamping may be combined in circuitry, an example of which is illustrated in FIG. 13. The circuit layout of FIG. 13 includes circuitry for providing each of the sharp turn on, tuning, and voltage clamping characteristics. However, it should be appreciated that some embodiments may include circuitry that provides a voltage transfer function having only one or two of these characteristics.

For providing a sharp turn on characteristic, the circuit layout of FIG. 13 includes two detectors arranged similarly to the circuit layout illustrated in FIG. 2C. Unlike the layout in FIG. 2C, one of the detectors is shown as being programmable to provide a tuning capability, as discussed in connection with the circuit layout of FIG. 12. The circuit layout of FIG. 13 also includes a diode-based clamping cell and a high-speed wideband buffer arranged to provide a voltage clamping characteristic for the voltage transfer function, as described above in connection with block diagram of FIG. 9A and the circuity layout illustrated in FIG. 10A.

For each of the transfer function characteristics (i.e., sharp turn on, tuning, voltage clamping), representative circuitry for one of the embodiments for providing the desired characteristic, as described above is included in the circuit layout of FIG. 13. However, it should be appreciated that circuitry discussed above in connection with alternate embodiments for providing the same transfer function characteristic may alternatively be used, and embodiments that combine circuitry for multiple desired transfer function characteristics are not limited based on the particular circuitry selected for the combination.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. An adaptive bias circuit, comprising:
   a first detector circuit configured to output a first current based on an input power, wherein the first detector circuit is configured to clamp the first current at a first input power level; and
   a second detector circuit configured to output a second current based on the input power, wherein the second detector circuit is configured to clamp the second current at a second input power level lower than the first input power level;
   wherein the first detector circuit and the second detector circuit are arranged to provide an output current that subtracts the second current from the first current.

2. The adaptive bias circuit of claim 1, wherein the first detector circuit comprises a first pair of coupling capacitors configured to set the first input power level at which the first current is clamped, and wherein the second detector circuit comprises a second pair of coupling capacitors configured to set the second input power level at which the second current is clamped.

3. The adaptive bias circuit of claim 1, further comprising:
   a first current mirror circuit configured to mirror the second current to a first node in the adaptive bias circuit that performs the subtraction of the second current from the first current.

4. The adaptive bias circuit of claim 3, further comprising:
   a constant current source, wherein the constant current source is arranged to adjust a response characteristic of the output current.

5. The adaptive bias circuit of claim 4, further comprising:
   a second current mirror circuit configured to mirror the output current to a second node in the adaptive bias circuit that performs the adjustment of the response characteristic of the output current.

6. The adaptive bias circuit of claim 1, wherein the first detector circuit and the second detector circuit each includes a plurality of MOSFETs configured to remain active across multiple input power levels to provide wideband adaptive biasing.

7. The adaptive bias circuit of claim 1, wherein the first current output from the first detector circuit and/or the second current output from second detector circuit results from algorithmic operations of the outputs from multiple detectors.

8. The adaptive bias circuit of claim 1, further comprising:
   a current mirror circuit configured to mirror the first current output from the first detector circuit to a node in the adaptive bias circuit that performs the subtraction of the second current from the first current; and a constant current source coupled to the node.

9. The adaptive bias circuit of claim 8, wherein the first detector circuit comprises a first pair of coupling capacitors configured to set the first input power level at which the first current is clamped, and wherein the second detector circuit comprises a second pair of coupling capacitors configured to set the second input power level at which the second current is clamped.

10. An adaptive bias circuit, comprising:
a first detector circuit configured to output a first current based on an input power, wherein the first detector circuit is configured to clamp the first current at a first input power level;
a second detector circuit configured to output a second current based on the input power, wherein the second detector circuit is configured to clamp the second current at a second input power level lower than the first input power level, wherein the first detector circuit and the second detector circuit are arranged to provide an output current that subtracts the second current from the first current at a node of the adaptive bias circuit; and
a tuning circuit configured to tune a transfer function of the output current.

11. The adaptive bias circuit of claim 10, wherein the tuning circuit comprises:
a pair of cascode transistors include a first transistor and a second transistor, wherein the first transistor is configured to MOSFET coupled to the node, wherein the first transistor and second transistor are configured to have different operating conditions.

12. The adaptive bias circuit of claim 10, wherein the tuning circuit comprises a plurality of detector cells, wherein at least some of the plurality of detector cells are configured to be selectively turned on or off to tune the transfer function.

* * * * *